US007354080B2

(12) United States Patent
Lee

(10) Patent No.: US 7,354,080 B2

(45) Date of Patent: Apr. 8, 2008

(54) LOCK MECHANISM FOR ELECTRONIC DEVICE

(75) Inventor: Shih-Liang Lee, Taipei (TW)

(73) Assignee: Compal Electronics, Inc., Taipei (TW)

( * ) Notice: Subject to any disclaimer, the term of this patent is extended or adjusted under 35 U.S.C. 154(b) by 10 days.

(21) Appl. No.: 11/162,834

(22) Filed: Sep. 26, 2005

(65) Prior Publication Data

US 2006/0261600 A1 Nov. 23, 2006

(30) Foreign Application Priority Data

May 23, 2005 (TW) .............................. 94208343 U

(51) Int. Cl.
*E05C 1/04* (2006.01)
*H05K 5/00* (2006.01)

(52) U.S. Cl. ...................... 292/162; 292/137; 292/150; 292/175; 312/223.2; 361/683

(58) Field of Classification Search ................ 292/162, 292/137, 140, 145, 150, 159, 175, 177, 179, 292/300, 302, DIG. 37, DIG. 4, 251.5; 312/223.3; 361/683

See application file for complete search history.

(56) References Cited

U.S. PATENT DOCUMENTS 413,245 A * 10/1889 Richmond .................. 292/175
1,104,707 A * 7/1914 Rath .......................... 292/179
1,702,621 A * 2/1929 Stelljes ....................... 292/334
1,857,943 A * 5/1932 Dawicki, Jr. ................ 292/207
2,252,591 A * 8/1941 Anderson .................... 292/63
2,313,711 A * 3/1943 Jacobi ......................... 70/145
2,468,969 A * 5/1949 Galey ......................... 292/144
2,571,353 A * 10/1951 Felsch ........................ 292/128
2,648,561 A * 8/1953 Landon ...................... 292/170
2,828,991 A * 4/1958 Stilger ........................ 292/175
3,360,969 A * 1/1968 Pennings et al. ............. 70/488
4,193,619 A * 3/1980 Jerila ......................... 292/168
4,343,162 A * 8/1982 Giacometti .................... 70/67
4,630,852 A * 12/1986 White et al. .................. 292/87
4,792,165 A * 12/1988 Nishimura ................... 292/19
5,253,142 A * 10/1993 Weng ......................... 361/681
5,984,381 A * 11/1999 Yamagishi ................... 292/45
6,068,307 A * 5/2000 Murphy ...................... 292/302
6,659,516 B2 12/2003 Wang et al. ............. 292/251.5
6,890,008 B1 * 5/2005 Chuang et al. ............. 292/121
7,050,295 B2 * 5/2006 Kang ......................... 361/683
7,054,149 B2 * 5/2006 Lev et al. ................... 361/683
2004/0189017 A1 * 9/2004 Chen et al. .............. 292/251.5
2006/0049645 A1 * 3/2006 Drumm ................... 292/251.5

FOREIGN PATENT DOCUMENTS

JP 5033545 * 2/1993
TW M246057 10/2004

* cited by examiner

*Primary Examiner*—Carlos Lugo
(74) *Attorney, Agent, or Firm*—Jianq Chyun IP Office

(57) ABSTRACT

A lock mechanism configured to be disposed in an electronic device is provided, including a first lock element, a recovering element, a balancing element, and a second lock element. The first lock element has a lock portion and is disposed in a first body of the electronic device along a moving axis in a sliding manner. The recovering element is disposed between the first lock element and the first body and supplies a recovering force along the moving axis. One side of the balancing element is lodged into the first body, and the other side is lodged into the first lock element. The second lock element is disposed on the second body of the electronic device, and lodged into the lock portion. The balancing element ensures that the first lock element moves smoothly along the moving axis without deviation.

13 Claims, 13 Drawing Sheets

200

LOCK MECHANISM FOR ELECTRONIC DEVICE

CROSS-REFERENCE TO RELATED APPLICATION

This application claims the priority benefit of Taiwan application serial no. 94208343, filed on May 23, 2005. All disclosure of the Taiwan application is incorporated herein by reference.

BACKGROUND OF THE INVENTION

1. Field of Invention

The present invention relates to a lock mechanism. More particularly, the present invention relates to a lock mechanism for electronic devices.

2. Description of Related Art

In the information age today, people more and more dependent on electronic devices. In order to meet the requirements of high speed, high efficiency, compactness, various portable electronic devices have become the mainstream product, for example, the notebook PC, cell phone, personal digital assistant (PDA) and the like have all been the indispensable devices in the modern life.

In order to achieve the objective of compactness, most portable electronic devices are designed to be foldable to save the area, such as the notebook PC, the foldable cell phone and the like. Most of the foldable portable electronic devices comprise two bodies, wherein one side of the two bodies are connected with each other through a pivoting mechanism, and the two folded bodies are fixed in relative positions by a lock mechanism in the other side of the two bodies.

Referring to FIG. 1, a schematic view of a conventional transverse lock mechanism in a foldable electronic device is shown. The lock mechanism 100, suitable for a foldable electronic device 50 having a cover 52 and a base 54, the lock mechanism 100 includes a press key 110 and an lock shaft 120, wherein the press key 110 is fixed to the lock shaft 120 and installed inside the cover 52 of the foldable electronic device 50, and the lock shaft 120 is provided in a shaft groove 52*a* inside the cover 52, and the lock shaft 120 is suitable for transversing to and fro in the shaft groove 52*a*.

Therefore, when the cover 52 of the foldable electronic device 50 is closed in the base 54, the two lock tenons 122 on the bottom of the lock shaft 120 will be locked in the two pin holes 54*a* in the base 54, and the lock state of the lock tenons and the pin hole 54*a* is kept by a recovering element 60. Moreover, when the cover 52 is to be opened, the press key 110 can be pushed transversely to push the lock shaft 120, so that the lock tenon is disengaged from the pin hole 54*a* of the base 54, and the lock state of the lock tenon and the lock groove 54*a* is released.

However, as the force body of the transverse lock mechanism moves by the transverse force, the force body must pass through a groove on the body case of the cover, and the length of the groove should be longer than the length of the force body. Accordingly, the appearance of the body case is damaged. Therefore, the conventional pressing lock mechanism is developed to avoid the formation of concave on the body case of the cover resulting from the overlong narrow groove.

The pressing lock mechanism includes a button, set up within the cover in a sliding manner and suitable for moving along a direction perpendicular to the surface of the cover by the outside force. However, when the horizontal length of the button is too long, the force area of the button accordingly turns longer. Therefore, when the button does not receive uniform force, for example, when one end of the surface of the button receives force while another end of the surface does not receive force, the sliding rail or the sliding mechanism between the button and the cover can be easily blocked. Accordingly the button can not be pushed to move smoothly. And, the lock state of the lock mechanism can not be released, which may cause trouble for users.

SUMMARY OF THE INVENTION

Accordingly, the present invention is directed to a lock mechanism suitable for a foldable electronic device to fix the relative positions of the two bodies of the foldable electronic device.

In order to achieve the objective of the present invention, a lock mechanism suitable for an electronic device is provided. The electronic device includes a first body and a corresponding second body. The lock mechanism includes a first lock element, a recovering element, a balancing element, and a second lock element. The first lock element having a lock portion is set up in a first body of the electronic device along a first moving axis in a sliding manner. The recover element, disposed between the first lock element and the first body, supplies a recovering force along the moving axis. One side of the balancing element is set up in the first body, and the other side is set up in the first lock element. Therefore, when the first lock element moves along the first moving axis by force and push the balancing element to move accordingly, the force is averagely distributed to the first lock element by the balancing element. The second lock element is set up on the second body of the electronic device to lock with the lock portion and fix the first body and the second body.

According to one embodiment of the present invention, the balancing element is set up in the first body along a pivoting axis line.

According to one embodiment of the present invention, the balancing element has a guide shaft, the first lock element has a guide groove, and the guide shaft is disposed in the guide groove. When the first lock element moves along the first moving axis line by force, the guide shaft will move along a second moving axis line and pivot along the pivoting axis line simultaneously. Wherein, the first moving axis line is perpendicular to the second moving axis line.

According to one embodiment of the present invention, the relative movement between the second lock element and the lock portion would push the first lock element to move until the second lock element is locked with the lock portion.

According to one embodiment of the present invention, the recovering element is a spring or a pair of repulsive magnets.

According to the above, the present invention additionally adds a balancing element to ensure the first lock element to move smoothly along a moving axis without any deviation. Accordingly, the lock mechanism can operate smoothly.

In order to the make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
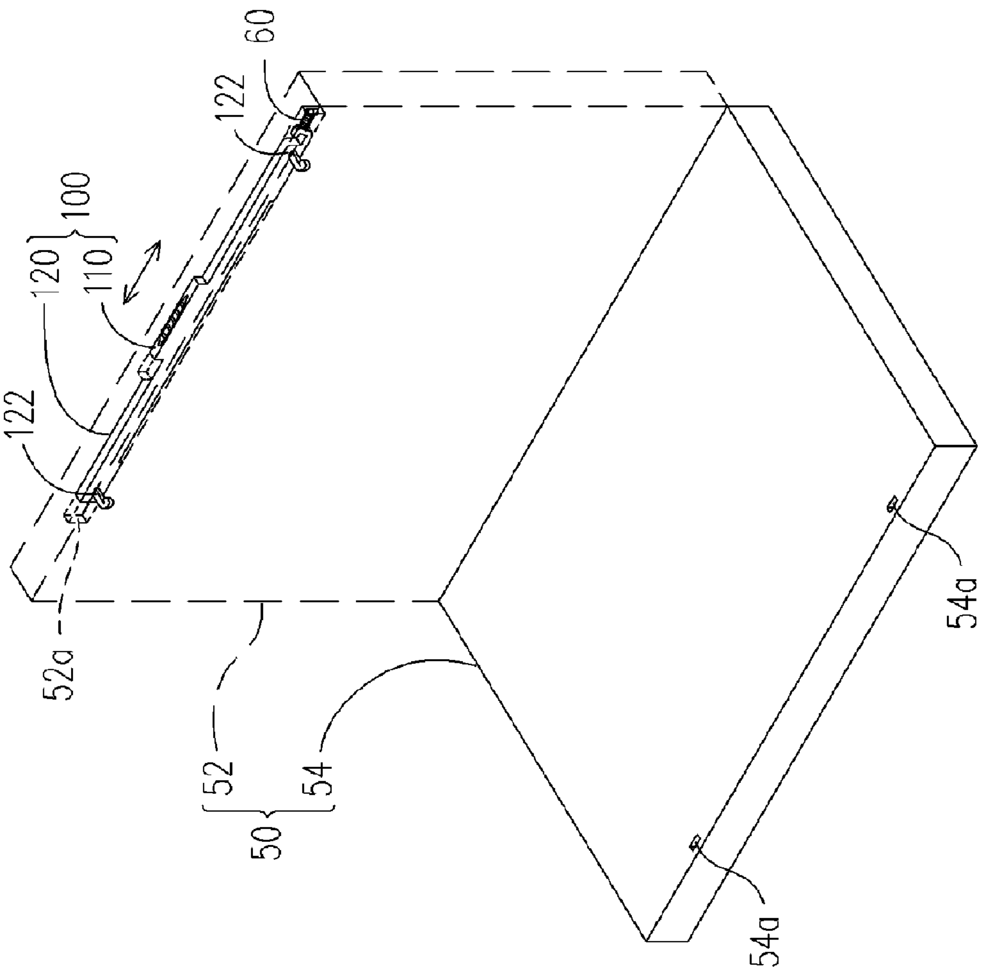
FIG. 1 (PRIOR ART)
FIG. 1 is a schematic view of a conventional transverse lock mechanism in a foldable electronic device.
Figure 2:
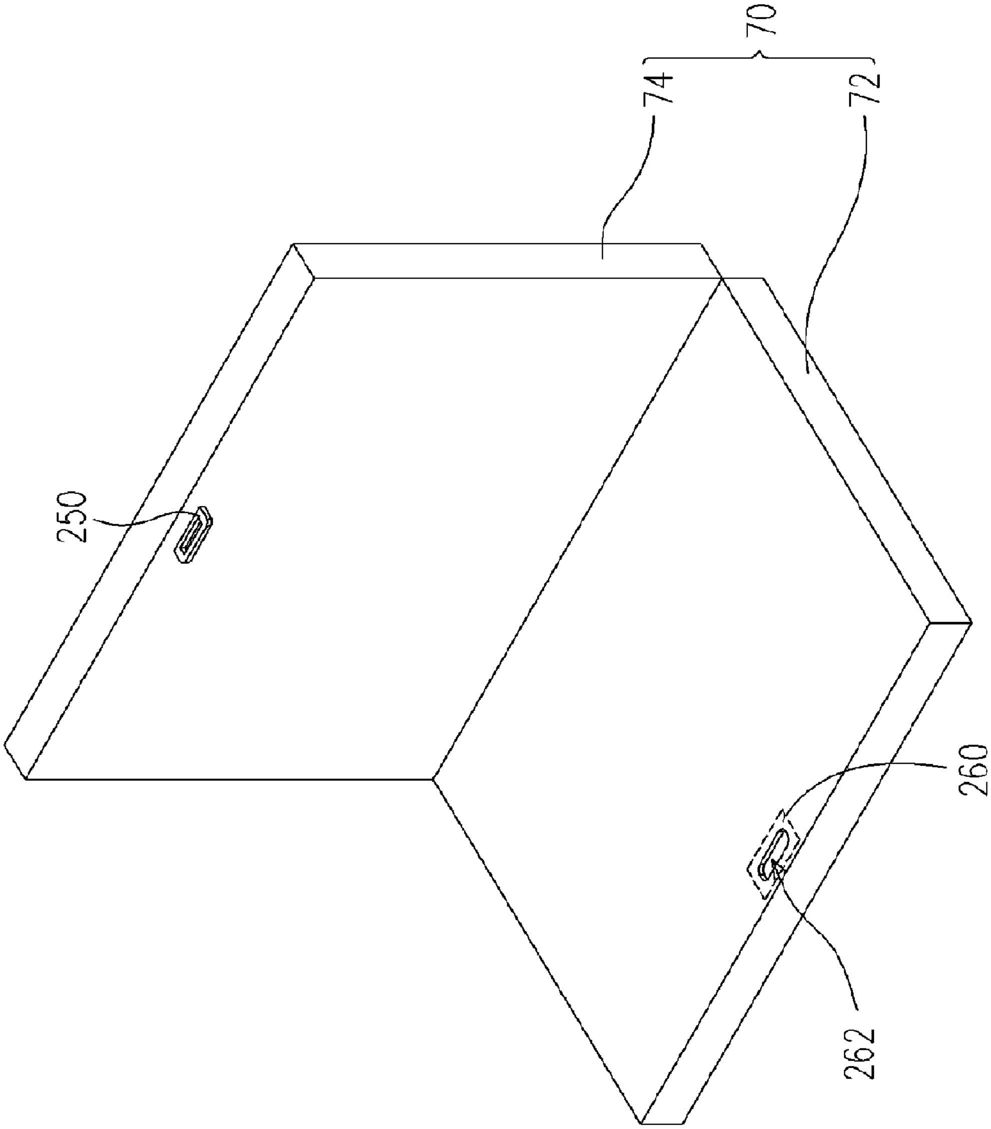
FIG. 2 is a schematic view of a lock mechanism in a foldable electronic device according to one embodiment of the present invention.

Referring to FIG. 2, a schematic view of a lock mechanism in a foldable electronic device according to one embodiment of the present invention is shown. In the embodiment, the foldable electronic device 70 includes a first body 72 and a corresponding second body 74, wherein, one side of the first body 72 is set up in one side of the second body 74. Only the second lock element 250 and the first limiting portion 260 of the lock mechanism are shown in FIG. 2, wherein the second lock element 250 is connected to the second body 74, and the first limiting portion 260 and the first limiting hole 262 are disposed on the cover portion of the first body 72.

Figure 3:
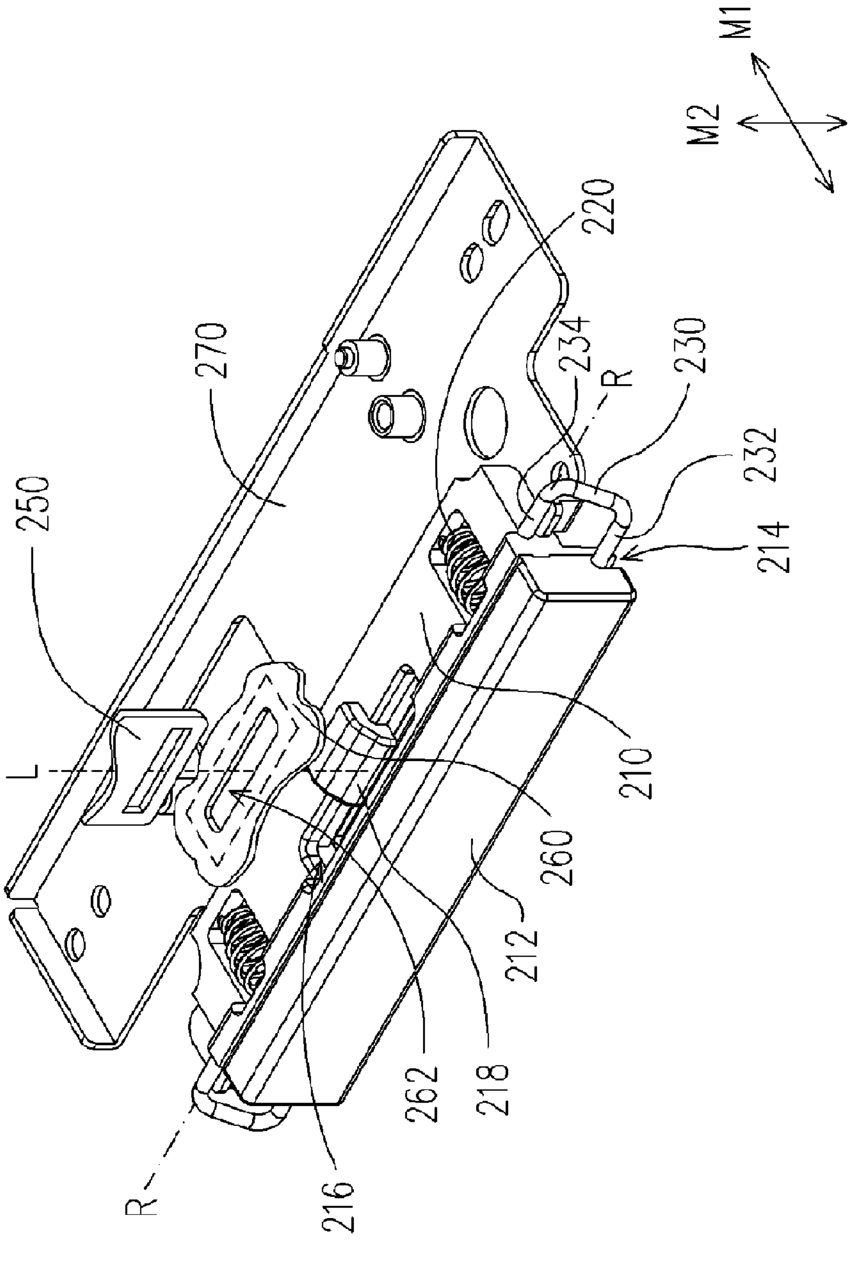
FIG. 3 is a part assembly view of a lock mechanism according to one embodiment of the present invention.
Figure 4:
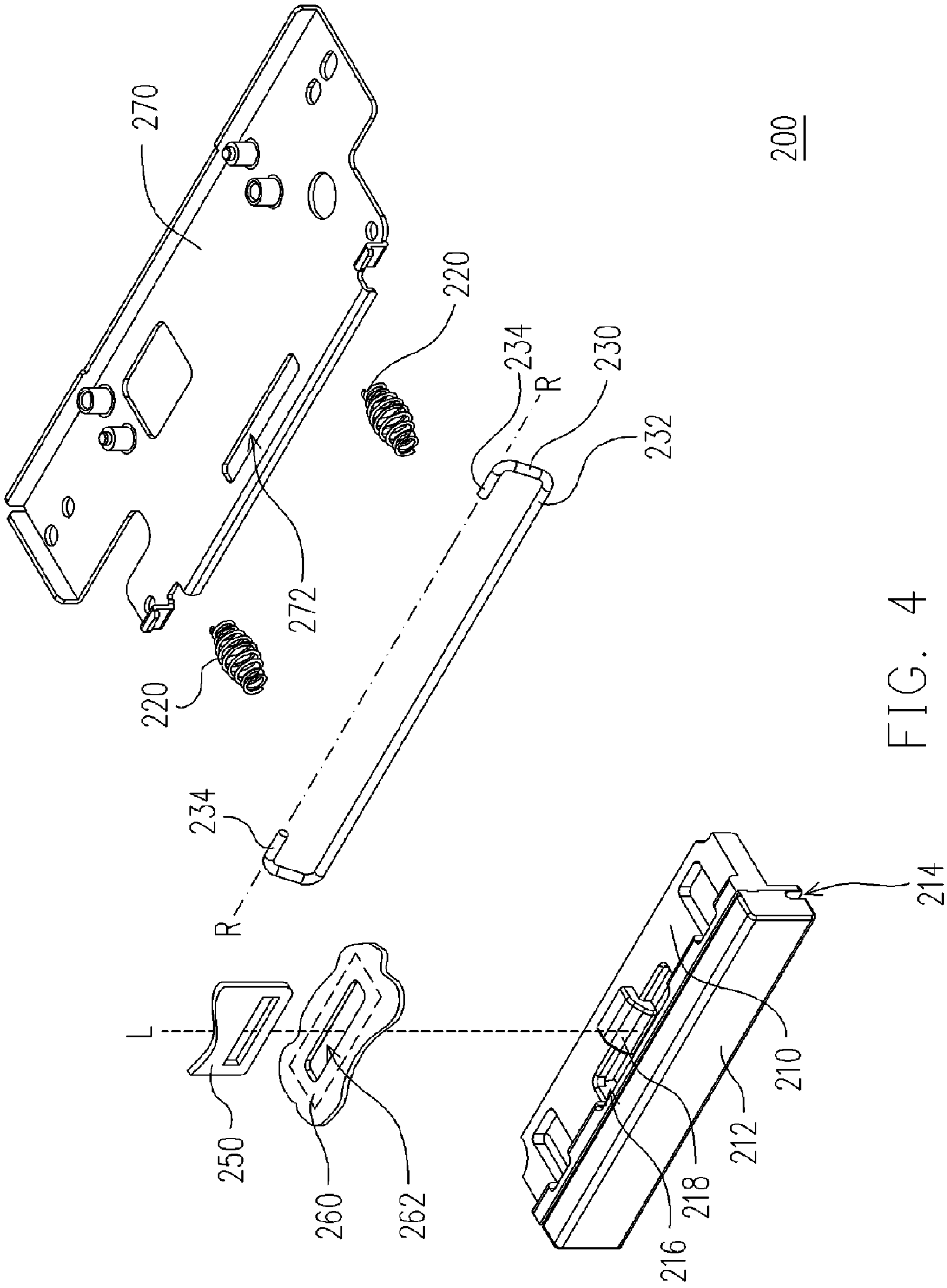
FIG. 4 is an explosive view of a lock mechanism in FIG. 3.
Figure 5:
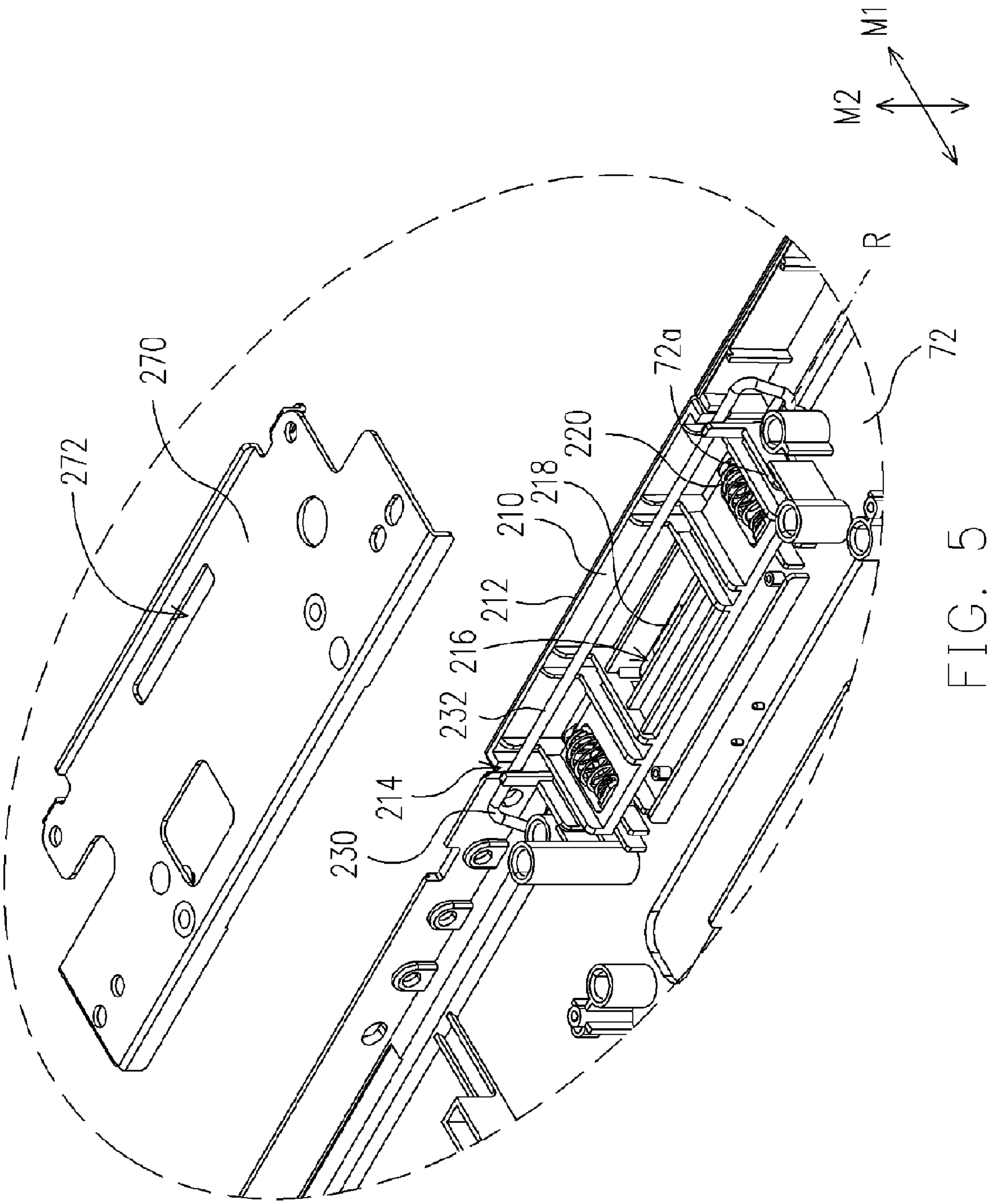
FIG. 5 is a schematic view of the first lock element disposed on the first body.
Figure 6:
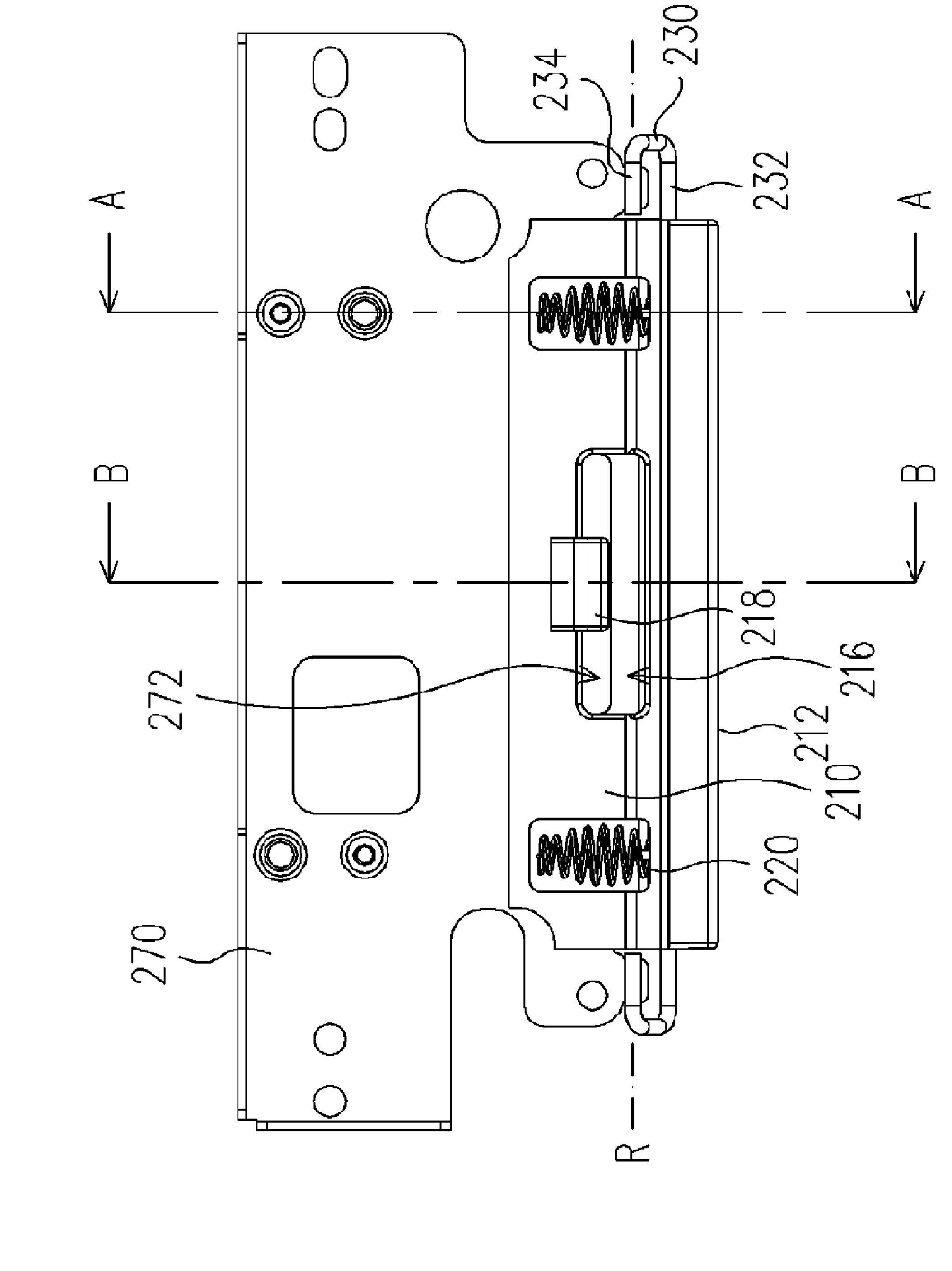
FIG. 6 is a top view of the lock mechanism in FIG. 3 (without the second lock element and the first limiting portion).
Figure 7A:
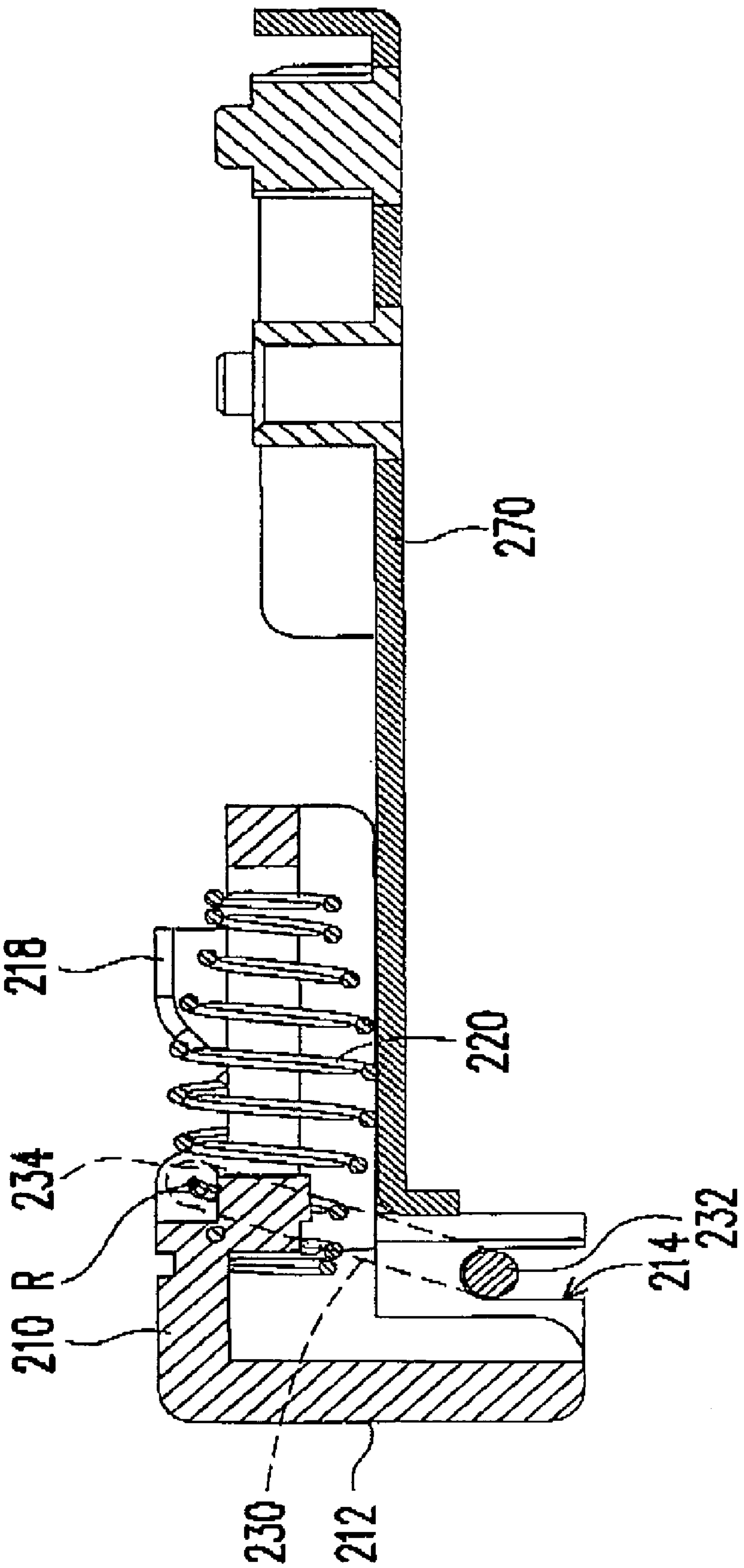
FIG. 7A is an enlarged cross-sectional view of FIG. 6 along line A-A.
Figure 7B:
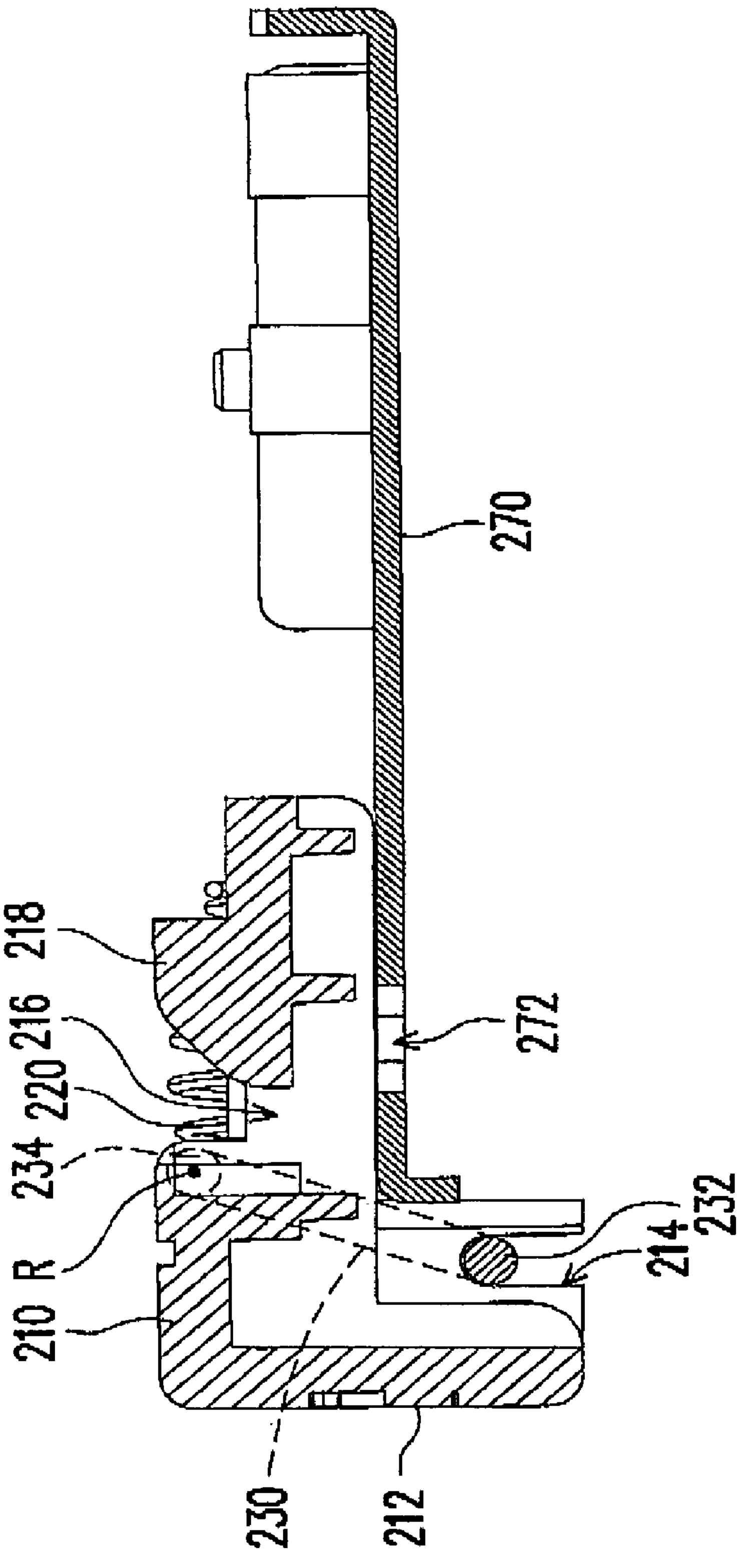
FIG. 7B is an enlarged cross-sectional view of FIG. 6 along line B-B.

Referring to FIG. 2, FIG. 3, FIG. 4, FIG. 5, FIG. 6 and FIG. 7A, wherein FIG. 3 is a part assembly view of the lock mechanism according to one embodiment of the present invention; FIG. 4 is an explosive view of a lock mechanism in FIG. 3; FIG. 5 is a schematic view of the first lock element disposed on the first body. In order to describe the operation of the first lock element 210 of the lock mechanism 200 set up on the first body 72, FIG. 5 is upside down and rotated for 180 degrees from FIG. 3 and FIG. 4. FIG. 6 is a top view of the lock mechanism in FIG. 3 (without the second lock element and the first limiting portion); FIG. 7A is an enlarged cross-sectional view of FIG. 6 along line A-A. As shown in the Figures, the lock mechanism 200 includes a first lock element 210, a recovering element 220, a balancing element 230, and a second lock element 250. Wherein, the first lock element 210 includes a pressing portion 212 and a lock portion 218, and the lock element 210 is set up in the sliding rail 72*a* in a sliding manner on the first body 72 along a first moving axis M1 (as shown in FIG. 5). In the embodiment, using the elastic force of the spiral spring or other types of spring as the recovering force, the recovering element 220 is set up between the first lock element 210 and the first body 72 and imposes an elastic force to the first lock element 210 relative to the first body 72 along the first moving axis line M1; one end of the balancing element 230 is set up in the first body 72, and the other end is set up in the first lock element 210. Therefore, when the first lock element 210 moves along the first moving axis line M1 by force to push the balancing element 230 to move simultaneously, the force imposed by the user can be averagely distributed to the first lock element 210 by the balancing element 230.

The operation relationship between the first lock element 210 and the balancing element 230 is described in detail herein. Referring to FIG. 2, FIG. 3, FIG. 5, FIG. 6 and FIG. 7B, FIG. 7B is an enlarged cross-sectional view of FIG. 6 along line B-B. When the user imposes force on the pressing portion 212, and particularly on one side of the pressing portion 212, the first lock element can not move smoothly to the inside of the first body 72 along the first moving direction M1. At this time, the cooperation of the guide groove 214 of the first lock element 210 and the guide shaft 232 of the balancing element 230 generate a guide effect, so that the first lock element 210 can only move along the first moving direction M1 without deviation. Accordingly, the first lock element 210 can move smoothly. In the embodiment, the balancing element 230 can be a linear metal shaft, the two ends of which can respectively form a pivoting shaft 234 after bended, and the balancing element 230 is set up on the first body 72 through the two pivot shafts 234 along the pivoting line R. Moreover, the balancing element 230 has a guide shaft 232 formed by the portion between the two pivoting shafts 234 of the balancing element 230. The guide shaft 232 is disposed within the guide groove 214. When the first lock element 210 moves along the first moving direction M1 by force, the first lock element 210 can drive the guide shaft 232 to move in the guide groove 214 and then drive the balancing element 230 to rotate along the rotating axis line R. Accordingly, the force on the first lock element 210 is averagely distributed on the first lock element 210 by the balancing element 230, so that the first lock element 210 can be sure to move along the first moving direction M1 smoothly without deviation. The guide shaft 232 moves along the second moving axis M2 in the guide groove 214 of the first lock element 210, and rotates along the rotating axis line R formed by the two pivoting shafts 234. Wherein, the first moving axis line M1, the second moving axis line M2 and the rotating axis line R of the embodiment are perpendicular to each other.

Referring to FIG. 2 and FIG. 3, in the embodiment, the lock portion 218 is integrated on the first lock element 210, and acts as a lock hook. Moreover, the second lock element 250 is provided on the second body 74 to lock the lock portion 218. In the embodiment, the second lock element 250 is configured corresponding to the lock portion 218 of the lock hook type, and acts as a lock ring. In other embodiments, the lock portion 218 can also be a lock ring, and the second lock element 250 can be the corresponding lock hook.

Referring to FIG. 3 and FIG. 4, when the user performs the locking or unlocking operation, the second lock element 250 proceeds along a lock path L. In the unlock condition, the user imposes force on the second body 74, accordingly the second lock element 250 is driven to pass through a first limiting hole 262, and then moves downward to contact the inclining surface of the lock portion 218, and the first lock element 210 is also driven to move to complete the locking process. In the locking state of the second lock element 250 and the lock portion 218, the pressing portion 212 of the first lock element 210 is pressed by finger to drive the first lock element 210 to move until the lock portion 218 connected to the first lock element 210 stops to contact the second lock element 250, so as to relieve the structural interference, and the second lock element 250 is driven by the predefined upward force to move upward along the lock path L. The locking process and the operation theory are described with the following flowchart in detail.

Referring to FIG. 5, FIG. 6, FIG. 7B, FIG. 8A to FIG. 8D, and FIG. 9A to FIG. 9D, wherein, FIG. 8A to FIG. 8D are schematic views of the flowchart of the lock mechanism in FIG. 5 in achieving a locking state, and FIG. 9A to FIG. 9D are schematic views of the flowchart of the lock mechanism in FIG. 5 in disengaging the locking state.

When the second lock element 250 is locked with the lock portion 218, the lock between the lock portion 218 and the second lock element 250 can be relieved by the deviation of the second lock element 250. Therefore, the lock mechanism 200 of the embodiment further includes a first limiting portion 260 and a second limiting portion 270 in order to ensure that there is no deviation in the second lock element 250. The first limiting portion 260 having a first limiting hole 262 is formed integrally on the first body 72. Moreover, the second limiting portion 270 having a second limiting hole 272 is a cover board disposed on the first body 72, and the first lock element 210 is disposed between the body case of the first body 72 and the second limiting portion 270. In addition, the first lock element 210 further has a third limiting hole 216 to limit the movement of the second lock element 250 passing through the first lock element 210.

Figure 8B:
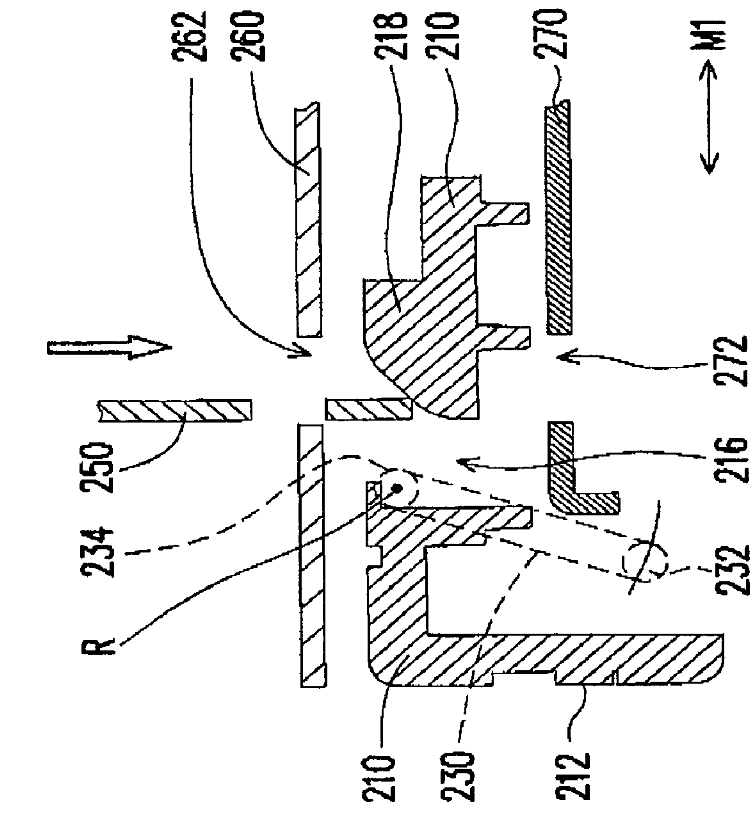
FIG. 8A to FIG. 8D are schematic views of the flowchart of the lock mechanism in FIG. 5 in achieving the locking state.
Figure 8A:
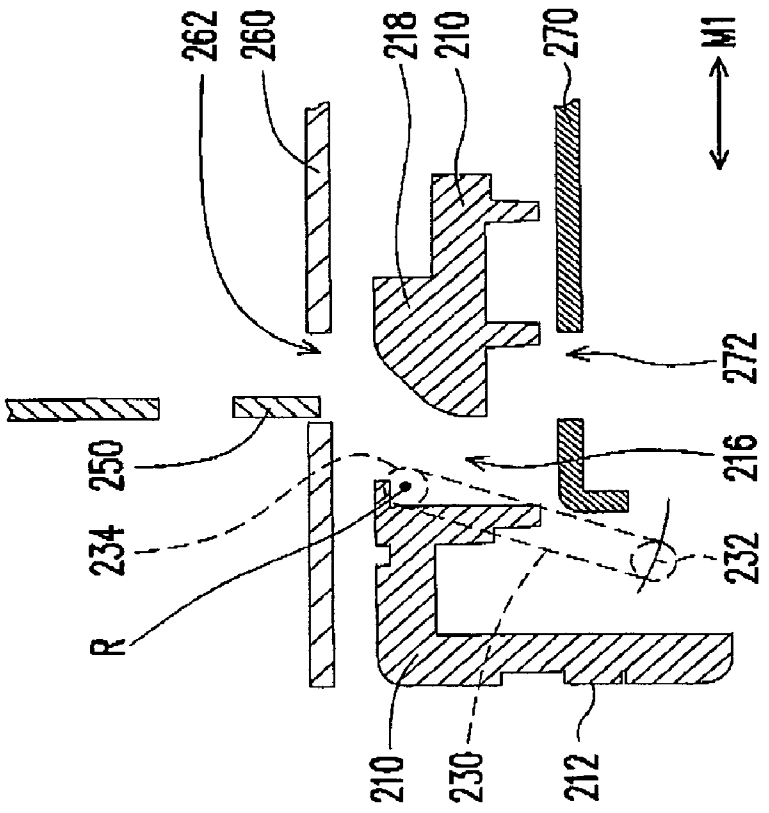
Figure 8D:
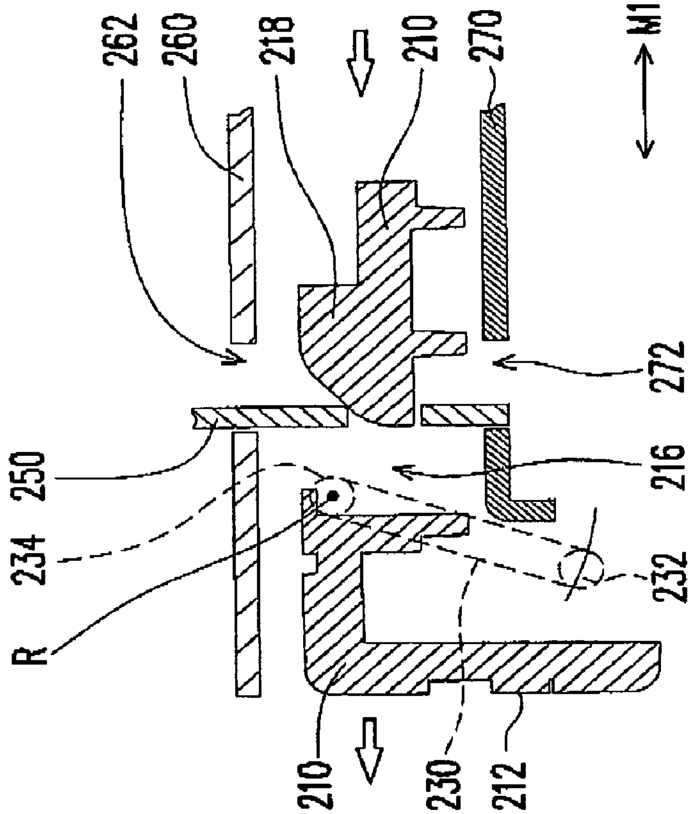
Figure 8C:
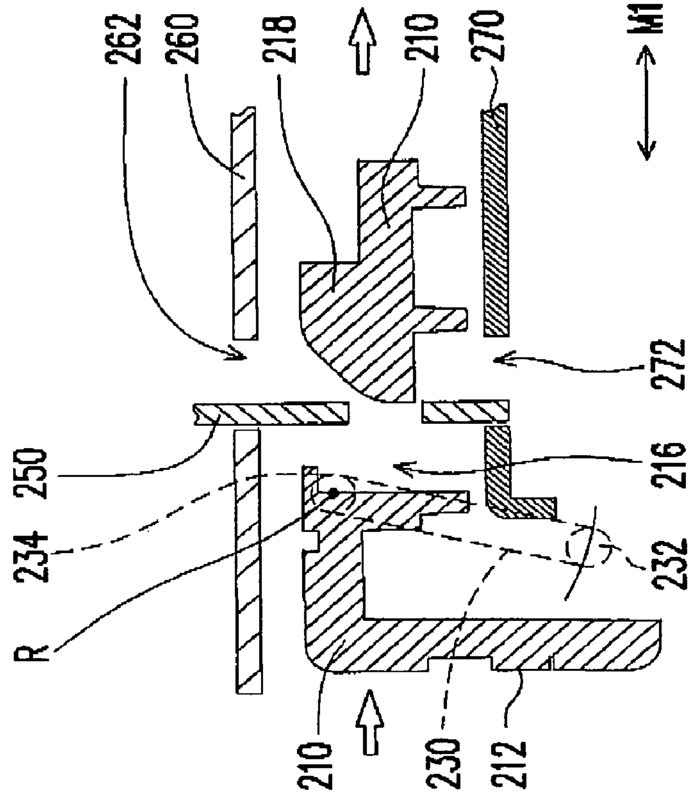

In the unlock condition as shown in FIG. 8A, the second lock element 250 is away from the lock portion 218. Next, as shown in FIG. 8B, in order to close the first body 72 and the second body 74 of the foldable electronic device 70 as shown in FIG. 2, a force is imposed to the second body 74 to drive the second lock element 250 to contact the lock portion 218 after passing through the first limiting hole 262 along the locking path L as shown in FIG. 3 and FIG. 4. Next, as shown in FIG. 8C, when the second lock element 250 contacts the inclining surface of the lock portion 218, the second lock element 250 is continuously forced to move downward to pass through the third limiting hole 216 to reach the second limiting hole 272, and the first lock element 210 is driven to move by the relative movement between the second lock element 250 and the lock portion 218 until the second lock element 250 stops to push the lock portion 218. Next, as shown in FIG. 8D, once the second lock element 250 stops to push the lock portion 218, the recovering element 220 as shown in FIG. 5 will provide a recovering force to the first lock element 210 along the first moving axis line M1 relative to the first body 72, so that the first lock element 210 returns to its original position along the first moving direction M1; meanwhile, the lock portion 218 is also driven to lock with the second lock element 250.

The above describes the locking process of the lock mechanism with reference of FIG. 8A to FIG. 8D, and the lock relieving process of the lock mechanism is described below with reference to FIG. 9A to FIG. 9D.

Figure 9B:
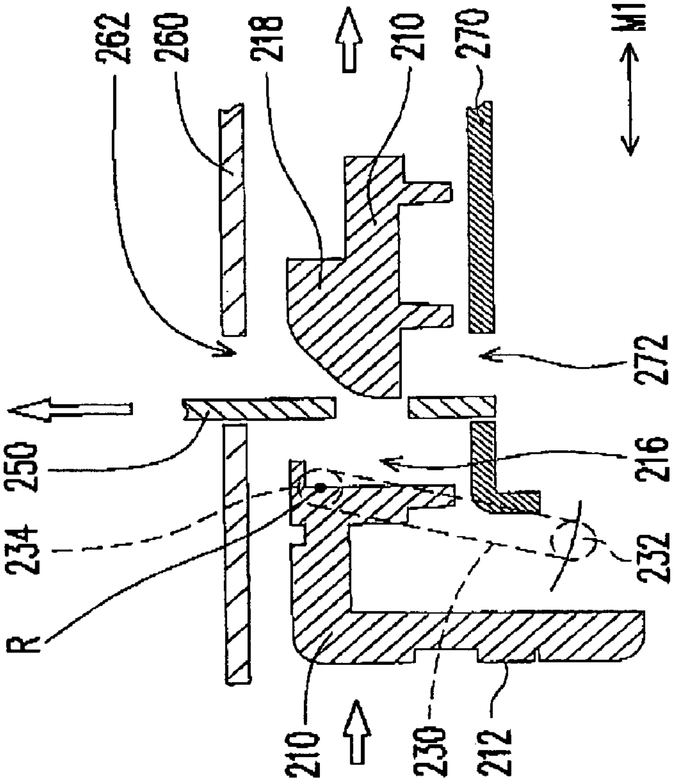
FIG. 9A to FIG. 9D are schematic views of the flowchart of the lock mechanism in FIG. 5 in disengaging the locking state.
Figure 9A:
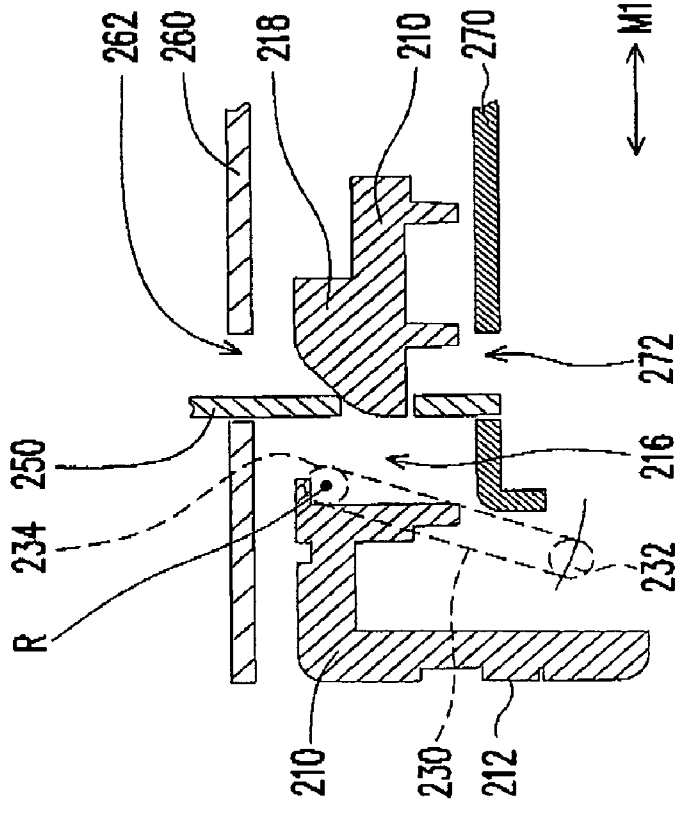
Figure 9D:
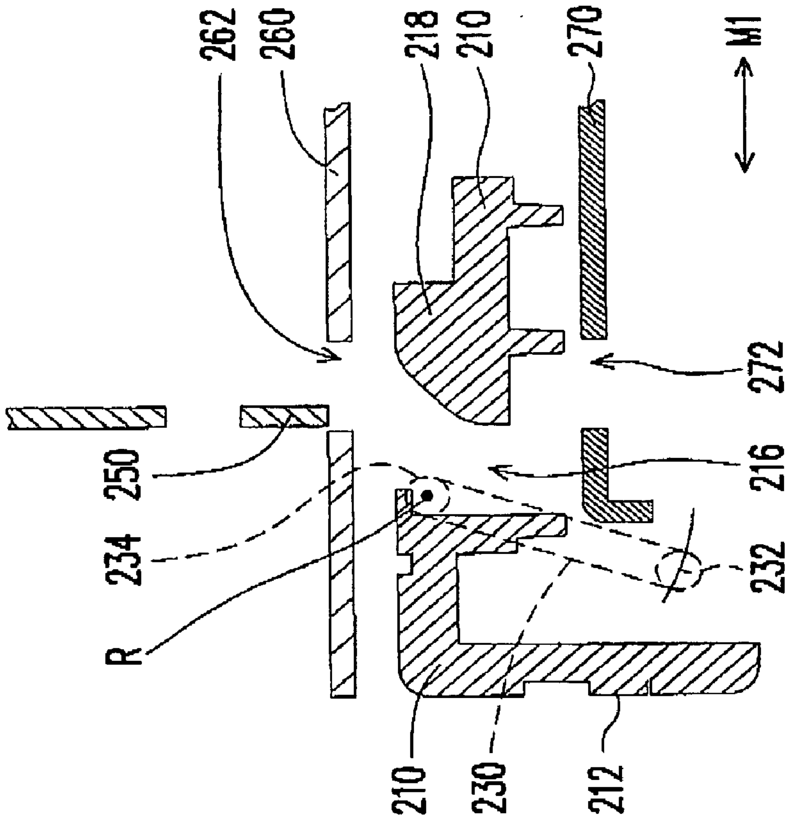
Figure 9C:
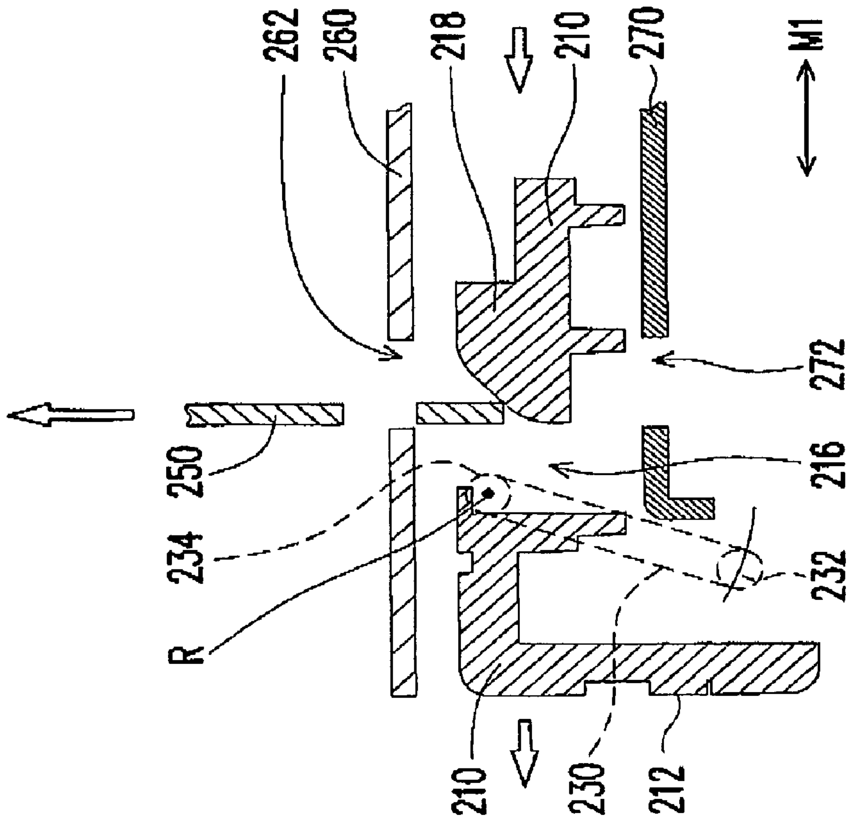

Referring to FIG. 9A, in the locked condition, the second lock element 250 and the lock portion 218 have structural interference. Next, as shown in FIG. 9B, when the user presses the pressing portion 212 of the first lock element 210 by finger, the first lock element 210 is driven to move until the lock portion 218 connected to the first lock element 210 stops to have structural interference with the second lock element 250. Next, as shown in FIG. 9C, after the structural interference between the lock portion 218 and the second lock element 250 is relieved, the second lock element 250 will be forced by a predefined upward force on the second body 74 to move upward along the locking path L as shown in FIG. 3 and FIG. 4; after disengaging from the lock portion 218, the second lock element 250 leaves the second limiting hole 272 and the third limiting hole 216. After the user releases the force on the pressing portion 212, the recovering element 220 in FIG. 5 will impose a recovering force to the first lock element 210 relative to the first body 72. Finally, as shown in FIG. 9D, the first lock element 210 will return to its original position along the first moving direction M1 by the recovering force imposed on the first lock element 210 relative to the body 72 by the recovering element 220.

Figure 10:
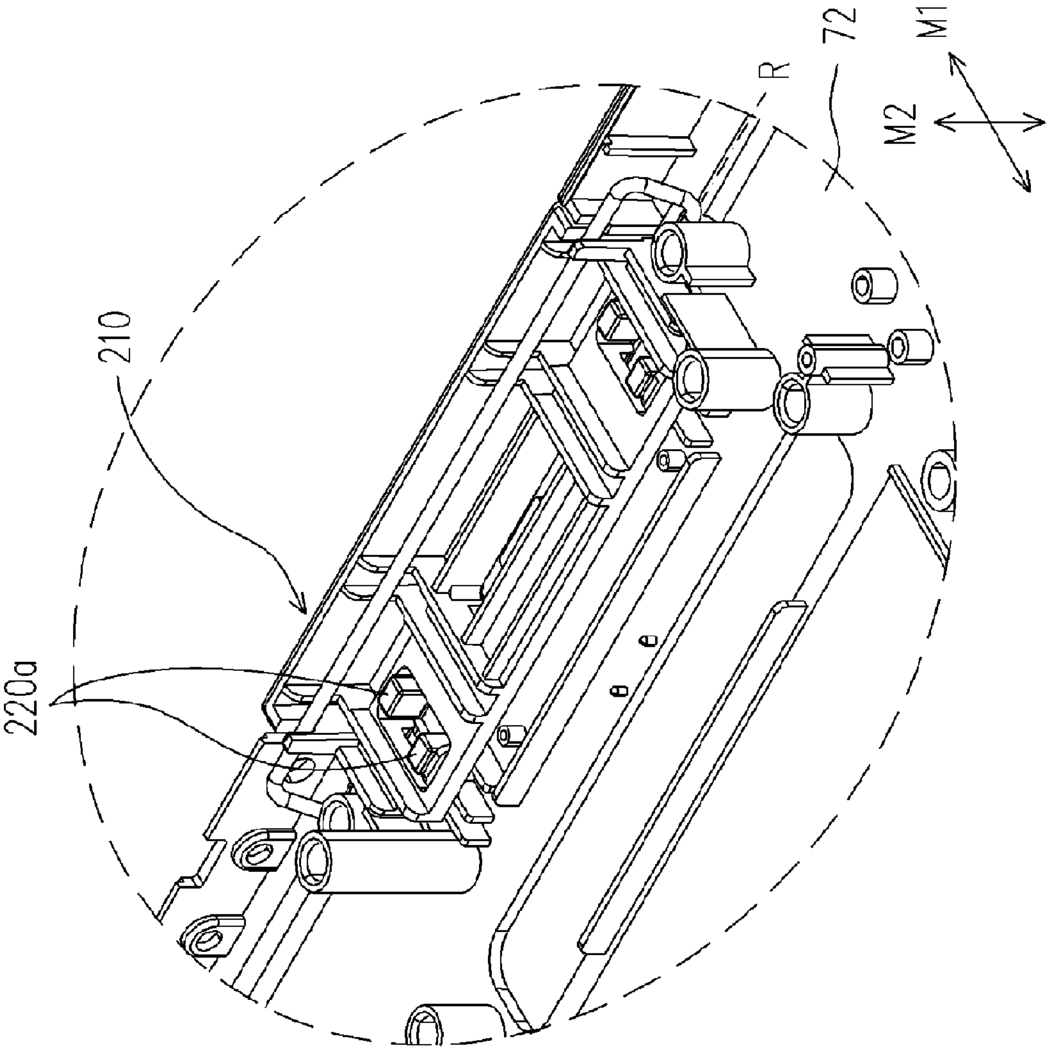
FIG. 10 is a schematic view of the recovering element according to another embodiment of the present invention.

Referring to FIG. 10, a schematic view of the recovering element according to another embodiment of the present invention is shown. As the recovering element of the present invention is to provide a recovering force for the first lock element 210 (returning to its original position), each recovering element 220*a* may also comprise a pair of repulsive magnets, and the repulsive force imposed on the first lock element 210 relative to the first body 72 acts as the recovering force.

In summary, the present invention makes use of the balancing element to keep the first lock element to move smoothly without deviation along a moving axis, accordingly the lock mechanism is able to operate smoothly. Moreover, in the embodiment of the present invention, although the lock mechanism is only applied in the foldable electronic device having two mutually pivoted bodies, it can also be applied in other electronic devices with a plurality of non-pivoted bodies to keep the two bodies of the electronic devices positioned by the lock mechanism of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device comprising:

a first body;

a second body pivoted on the first body;

a lock mechanism, comprising:

- a first logic element, having a lock portion, and disposed in the first body of the electronic device along a first moving axis in a sliding manner;
- a recovering element, disposed between the first lock element and the first body, for supplying a recovering force along the first moving axis;
- a balancing element, one side thereof being pivoted on the first body, and the other side thereof being pivoted on the first lock element, wherein when the first lock element is moved along the first moving axis to push the balancing element, the balancing element ensures that the first lock element is moved along the first moving axis; and
- a second lock element, disposed on the second body of the electronic device, for lodging into the lock portion and positioning the first body and the second body; and a first limiting portion disposed in the first body and having a first limiting hole for restricting the movement of the second lock element passing through the first limiting hole.

2. The electronic device as claimed in claim 1, wherein the balancing element is disposed in the first body along a rotating axis.

3. The electronic device as claimed in claim 2, wherein the balancing element has a guide axis, the first lock element has a guide groove, and the guide axis is located in the guide groove; when the first lock element is moved along the first moving axis by force, the guide axis moves along a second moving axis and the balancing element rotates around the rotating axis simultaneously.

4. The electronic device as claimed in claim 3, wherein the first moving axis is perpendicular to the second moving axis.

5. The electronic device as claimed in claim 1, wherein the relative movement between the second lock element and the lock portion would push the first lock element until the second lock element is lodged into the lock portion.

6. The electronic device as claimed in claim 1, wherein the lock portion is a lock hook, and the second lock element is a corresponding lock link.

7. The electronic device as claimed in claim 1, wherein the lock portion is a lock link, and the second lock element is a corresponding lock hook.

8. The electronic device as claimed in claim 1, wherein the recovering element is a spring.

9. The electronic device as claimed in claim 1, wherein the recovering element is a pair of magnets with repulsive force.

10. The electronic device as claimed in claim 1, wherein the first limiting portion is integrally formed in the first body.

11. The electronic device as claimed in claim 1, further comprising a second limiting portion disposed in the first body and having a second limiting hole corresponding to the first limiting hole.

12. The electronic device as claimed in claim 11, wherein the second limiting portion is a cover plate.

13. The electronic device as claimed in claim 1, wherein the first lock element further comprises a third limiting hole, corresponding to the first limiting hole.

* * * * *